US007829991B2

(12) United States Patent
Moden et al.

(10) Patent No.: US 7,829,991 B2
(45) Date of Patent: **\*Nov. 9, 2010**

(54) STACKABLE CERAMIC FBGA FOR HIGH THERMAL APPLICATIONS

(75) Inventors: Walter L. Moden, Meridian, ID (US);
David J. Corisis, Meridian, ID (US);
Leonard E. Mess, Boise, ID (US);
Larry D. Kinsman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 328 days.

This patent is subject to a terminal disclaimer.

(21) Appl. No.: 11/874,531

(22) Filed: Oct. 18, 2007

(65) Prior Publication Data

US 2008/0042252 A1    Feb. 21, 2008

Related U.S. Application Data

(60) Division of application No. 11/063,403, filed on Feb. 22, 2005, now Pat. No. 7,285,442, which is a continuation of application No. 10/706,210, filed on Nov. 12, 2003, now Pat. No. 6,858,926, which is a division of application No. 09/924,635, filed on Aug. 8, 2001, now Pat. No. 6,650,007, which is a continuation of application No. 09/344,279, filed on Jun. 30, 1999, now Pat. No. 6,297,548.

(60) Provisional application No. 60/091,205, filed on Jun. 30, 1998.

(51) Int. Cl.
*H01L 23/02* (2006.01)

(52) U.S. Cl. .................. 257/686; 257/685; 257/723; 257/777; 438/109

(58) Field of Classification Search .......... 257/E23.023, 257/686, 685, 687, 698, 723, 725, 730–733, 257/737, 777; 438/109, 613
See application file for complete search history.

(56) References Cited

U.S. PATENT DOCUMENTS

| 3,370,203 A | 2/1968 | Kravitz et al. |
| 3,904,934 A | 9/1975 | Martin |
| 4,143,456 A | 3/1979 | Inoue |
| 4,264,917 A | 4/1981 | Ugon |
| 4,300,153 A | 11/1981 | Hayakawan et al. |

(Continued)

FOREIGN PATENT DOCUMENTS

JP         5277684         6/1977

(Continued)

OTHER PUBLICATIONS

Lin et al., Bumpless Flip Chip Packages for Cost/Performance Driven Devices, Electronic Components and Technology, Conference 2003, Publication Date, May 27-30, 2003, pp. 554-559.

Imoto et al., Development of 3-Dimensional Module Package, "System Block Module", 2001 Electronic Components and Technology Conference, Publication Date, May 29-Jun. 1, 2001, pp. 552-557.

Pienimaa et al., Stacked Modular Package, Advanced Packaging, IEEE Transactions, Publication Date, Aug. 2004, vol. 27, Issue 3, pp. 461-466.

(Continued)

*Primary Examiner*—Chris Chu
(74) *Attorney, Agent, or Firm*—TraskBritt

(57) ABSTRACT

An apparatus package for high-temperature thermal applications for ball grid array semiconductor devices and a method of packaging ball grid array semiconductor devices.

18 Claims, 5 Drawing Sheets

U.S. PATENT DOCUMENTS

| | | | |
|---|---|---|---|
| 4,323,914 A | 4/1982 | Berndlmaier et al. | |
| 4,358,552 A | 11/1982 | Shinohara et al. | |
| 4,507,675 A | 3/1985 | Fujii et al. | |
| 4,642,671 A | 2/1987 | Rohsler et al. | |
| 4,801,998 A | 1/1989 | Okuaki | |
| 4,835,120 A | 5/1989 | Mallik et al. | |
| 4,862,245 A | 8/1989 | Pashby et al. | |
| 4,931,852 A | 6/1990 | Brown et al. | |
| 4,961,107 A | 10/1990 | Geist et al. | |
| 4,984,059 A | 1/1991 | Kubota et al. | |
| 4,994,411 A | 2/1991 | Naito et al. | |
| 5,019,673 A | 5/1991 | Juskey et al. | |
| 5,051,275 A | 9/1991 | Wong | |
| 5,086,018 A | 2/1992 | Conru et al. | |
| 5,101,465 A | 3/1992 | Murphy | |
| 5,108,955 A | 4/1992 | Ishida et al. | |
| 5,111,278 A | 5/1992 | Eichelberger | |
| 5,128,831 A | 7/1992 | Fox, III et al. | |
| 5,144,747 A | 9/1992 | Eichelberger | |
| 5,172,303 A * | 12/1992 | Bernardoni et al. | 361/744 |
| 5,173,764 A | 12/1992 | Higgins, III | |
| 5,184,208 A | 2/1993 | Sakuta et al. | |
| 5,194,930 A | 3/1993 | Papathomas et al. | |
| 5,218,759 A | 6/1993 | Juskey et al. | |
| 5,220,489 A | 6/1993 | Barreto et al. | |
| 5,241,133 A | 8/1993 | Mullen, III et al. | |
| 5,241,456 A | 8/1993 | Marcinkiewicz et al. | |
| 5,252,853 A | 10/1993 | Michii | |
| 5,266,834 A * | 11/1993 | Nishi et al. | 257/706 |
| 5,278,726 A | 1/1994 | Bernardoni et al. | |
| 5,280,192 A | 1/1994 | Kryzaniwsky | |
| 5,285,352 A | 2/1994 | Pastore et al. | |
| 5,286,679 A | 2/1994 | Farnworth et al. | |
| 5,293,068 A | 3/1994 | Kohno et al. | |
| 5,295,044 A * | 3/1994 | Araki et al. | 361/709 |
| 5,299,092 A | 3/1994 | Yaguchi et al. | |
| 5,304,842 A | 4/1994 | Farnworth et al. | |
| 5,311,060 A | 5/1994 | Rostoker et al. | |
| 5,313,096 A | 5/1994 | Eide | |
| 5,313,366 A | 5/1994 | Gaudenzi et al. | |
| 5,334,857 A | 8/1994 | Mennitt et al. | |
| 5,344,795 A | 9/1994 | Hashemi et al. | |
| 5,373,189 A | 12/1994 | Massit et al. | |
| 5,376,825 A * | 12/1994 | Tukamoto et al. | 257/685 |
| 5,379,186 A | 1/1995 | Gold et al. | |
| 5,383,269 A * | 1/1995 | Rathmell et al. | 29/830 |
| 5,384,689 A | 1/1995 | Shen | |
| 5,394,303 A | 2/1995 | Yamaji | |
| 5,434,105 A | 7/1995 | Liou | |
| 5,436,203 A | 7/1995 | Lin | |
| 5,440,169 A | 8/1995 | Tomita et al. | |
| 5,441,684 A | 8/1995 | Lee | |
| 5,450,283 A | 9/1995 | Lin et al. | |
| 5,461,255 A | 10/1995 | Chan et al. | |
| 5,483,024 A | 1/1996 | Russell et al. | |
| 5,484,959 A | 1/1996 | Burns | |
| 5,488,254 A | 1/1996 | Nishimura et al. | |
| 5,489,538 A | 2/1996 | Rostoker et al. | |
| 5,489,801 A | 2/1996 | Blish, II | |
| 5,552,635 A | 9/1996 | Kim et al. | |
| 5,598,033 A | 1/1997 | Behlen et al. | |
| 5,598,034 A | 1/1997 | Wakefield | |
| 5,604,376 A | 2/1997 | Hamburgen et al. | |
| 5,608,265 A | 3/1997 | Kitano et al. | |
| 5,616,958 A | 4/1997 | Laine et al. | |
| 5,625,221 A | 4/1997 | Kim et al. | |
| 5,633,530 A * | 5/1997 | Hsu | 257/685 |
| 5,641,997 A | 6/1997 | Ohta et al. | |
| 5,652,461 A | 7/1997 | Ootsuki et al. | |
| 5,656,857 A | 8/1997 | Kishita | |
| 5,659,952 A | 8/1997 | Kovac et al. | |
| 5,661,086 A | 8/1997 | Nakashima et al. | |
| 5,668,405 A | 9/1997 | Yamashita | |
| 5,677,566 A | 10/1997 | King et al. | |
| 5,701,233 A | 12/1997 | Carson et al. | |
| 5,754,408 A | 5/1998 | Derouiche | |
| 5,770,889 A | 6/1998 | Rostoker et al. | |
| 5,781,415 A * | 7/1998 | Itoh | 361/790 |
| 5,798,564 A * | 8/1998 | Eng et al. | 257/686 |
| 5,814,885 A | 9/1998 | Pogge et al. | |
| 5,835,988 A | 11/1998 | Ishii | |
| 5,838,061 A * | 11/1998 | Kim | 257/686 |
| 5,844,315 A | 12/1998 | Melton et al. | |
| 5,866,953 A | 2/1999 | Akram et al. | |
| 5,883,426 A | 3/1999 | Tokuno et al. | |
| 5,952,611 A | 9/1999 | Eng et al. | |
| 5,973,403 A | 10/1999 | Wark | |
| 5,973,924 A * | 10/1999 | Gillespie, Jr. | 361/735 |
| 5,991,161 A | 11/1999 | Samaras et al. | |
| 6,013,946 A | 1/2000 | Lee et al. | |
| 6,013,948 A | 1/2000 | Akram et al. | |
| 6,093,029 A * | 7/2000 | Kwon et al. | 439/69 |
| 6,127,726 A | 10/2000 | Bright et al. | |
| 6,137,163 A | 10/2000 | Kim et al. | |
| 6,162,693 A | 12/2000 | Wang et al. | |
| 6,172,423 B1 * | 1/2001 | Lee | 257/780 |
| 6,172,874 B1 * | 1/2001 | Bartilson | 361/719 |
| 6,188,127 B1 | 2/2001 | Senba et al. | |
| 6,190,929 B1 | 2/2001 | Wang et al. | |
| 6,198,634 B1 | 3/2001 | Armezzani et al. | |
| 6,235,554 B1 * | 5/2001 | Akram et al. | 438/109 |
| 6,277,674 B1 | 8/2001 | Wang et al. | |
| 6,297,548 B1 | 10/2001 | Moden et al. | |
| 6,313,522 B1 | 11/2001 | Akram et al. | |
| 6,335,571 B1 | 1/2002 | Capote et al. | |
| 6,417,546 B2 | 7/2002 | Trivedi et al. | |
| 6,420,789 B1 | 7/2002 | Tay et al. | |
| 6,448,664 B1 | 9/2002 | Tay et al. | |
| 6,476,476 B1 * | 11/2002 | Glenn | 257/686 |
| 6,498,101 B1 | 12/2002 | Wang | |
| 6,501,165 B1 | 12/2002 | Farnworth et al. | |
| 6,503,805 B2 | 1/2003 | Wang et al. | |
| 6,511,868 B2 | 1/2003 | Wang et al. | |
| 6,522,018 B1 | 2/2003 | Tay et al. | |
| 6,522,019 B2 | 2/2003 | Tay et al. | |
| 6,522,375 B1 | 2/2003 | Jang et al. | |
| 6,541,395 B1 | 4/2003 | Trivedi et al. | |
| 6,548,383 B1 | 4/2003 | Trivedi et al. | |
| 6,555,455 B1 | 4/2003 | Wang et al. | |
| 6,559,053 B1 | 5/2003 | Wang et al. | |
| 6,566,745 B1 | 5/2003 | Beyne et al. | |
| 6,583,518 B2 | 6/2003 | Trivedi et al. | |
| 6,586,826 B1 * | 7/2003 | Glenn et al. | 257/686 |
| 6,599,789 B1 | 7/2003 | Abbott et al. | |
| 6,600,335 B2 | 7/2003 | Tay et al. | |
| 6,613,617 B2 | 9/2003 | Trivedi et al. | |
| 6,650,007 B2 * | 11/2003 | Moden et al. | 257/686 |
| 6,666,751 B1 | 12/2003 | Wang | |
| 6,667,544 B1 * | 12/2003 | Glenn | 257/686 |
| 6,673,715 B2 | 1/2004 | Trivedi et al. | |
| 6,674,175 B2 | 1/2004 | Tay et al. | |
| 6,693,363 B2 | 2/2004 | Tay et al. | |
| 6,700,783 B1 * | 3/2004 | Liu et al. | 361/704 |
| 6,703,263 B2 | 3/2004 | Wang et al. | |
| 6,716,687 B2 | 4/2004 | Wang et al. | |
| 6,723,597 B2 | 4/2004 | Abbott et al. | |
| 6,730,553 B2 | 5/2004 | Cho et al. | |
| 6,734,905 B2 | 5/2004 | Fossum et al. | |
| 6,740,983 B2 | 5/2004 | Tay et al. | |
| 6,740,984 B2 | 5/2004 | Tay et al. | |
| 6,744,102 B2 | 6/2004 | Trivedi et al. | |
| 6,753,599 B2 * | 6/2004 | Kim | 257/686 |
| 6,767,778 B2 | 7/2004 | Wang et al. | |
| 6,770,921 B2 | 8/2004 | Trivedi et al. | |

| | | |
|---|---|---|
| 6,773,960 B2 | 8/2004 | Fee et al. |
| 6,774,022 B2 | 8/2004 | Wang et al. |
| 6,777,794 B2 * | 8/2004 | Nakajima .................. 257/686 |
| 6,784,062 B2 | 8/2004 | Cho et al. |
| 6,784,525 B2 | 8/2004 | Kuan et al. |
| 6,787,923 B2 | 9/2004 | Tan et al. |
| 6,792,142 B1 | 9/2004 | Wang |
| 6,803,958 B1 | 10/2004 | Wang |
| 6,808,994 B1 | 10/2004 | Wang |
| 6,812,103 B2 | 11/2004 | Wang et al. |
| 6,812,529 B2 | 11/2004 | Trivedi et al. |
| 6,833,627 B2 | 12/2004 | Farnworth |
| 6,835,599 B2 | 12/2004 | Kuan et al. |
| 6,847,220 B2 | 1/2005 | Tay et al. |
| 6,850,642 B1 | 2/2005 | Wang |
| 6,856,010 B2 * | 2/2005 | Roeters et al. ............. 257/686 |
| 6,856,155 B2 | 2/2005 | Tay et al. |
| 6,858,926 B2 * | 2/2005 | Moden et al. ............... 257/686 |
| 6,864,155 B2 | 3/2005 | Wang |
| 6,867,131 B2 | 3/2005 | Wang et al. |
| 6,870,247 B2 | 3/2005 | Fee et al. |
| 6,872,660 B2 | 3/2005 | Trivedi et al. |
| 6,900,494 B2 | 5/2005 | Abbott et al. |
| 6,903,420 B2 | 6/2005 | Wang |
| 6,906,407 B2 * | 6/2005 | Byers et al. ................. 257/686 |
| 6,906,415 B2 | 6/2005 | Jiang et al. |
| 6,913,476 B2 | 7/2005 | Yean et al. |
| 6,927,473 B2 | 8/2005 | Wang et al. |
| 6,930,029 B2 | 8/2005 | Wang et al. |
| 6,936,894 B2 | 8/2005 | Wang |
| 6,946,325 B2 | 9/2005 | Yean et al. |
| 6,949,479 B2 | 9/2005 | Wang |
| 6,951,777 B2 | 10/2005 | Fee et al. |
| 6,962,841 B2 | 11/2005 | Trivedi et al. |
| 6,972,214 B2 | 12/2005 | Kuan et al. |
| 6,972,794 B1 | 12/2005 | Wang et al. |
| 6,974,757 B2 | 12/2005 | Wang |
| 6,977,419 B2 | 12/2005 | Wang et al. |
| 6,984,570 B2 | 1/2006 | Wang |
| 6,987,291 B2 | 1/2006 | Abbott et al. |
| 7,009,188 B2 | 3/2006 | Wang |
| 7,012,293 B2 | 3/2006 | Wang |
| 7,013,044 B2 | 3/2006 | Wang |
| 7,018,871 B2 | 3/2006 | Tan et al. |
| 7,026,548 B2 | 4/2006 | Bolken et al. |
| 7,030,640 B2 | 4/2006 | Yee et al. |
| 7,061,124 B2 | 6/2006 | Tan et al. |
| 7,071,012 B2 | 7/2006 | Tan et al. |
| 7,095,083 B2 | 8/2006 | Cho et al. |
| 7,097,036 B2 * | 8/2006 | Morita ....................... 206/501 |
| 7,109,105 B2 | 9/2006 | Wang et al. |
| 7,112,482 B2 | 9/2006 | Abbott et al. |
| 7,112,876 B2 | 9/2006 | Fee et al. |
| 7,116,122 B2 | 10/2006 | Tay et al. |
| 7,145,228 B2 | 12/2006 | Yean et al. |
| 7,151,303 B2 | 12/2006 | Wang et al. |
| 7,153,731 B2 | 12/2006 | Abbott et al. |
| 7,154,146 B2 | 12/2006 | Wang et al. |
| 7,169,662 B2 | 1/2007 | Cho et al. |
| 7,186,168 B2 | 3/2007 | Wang |
| 7,189,606 B2 | 3/2007 | Wang et al. |
| 7,190,074 B2 | 3/2007 | Tan et al. |
| 7,198,980 B2 | 4/2007 | Jiang et al. |
| 7,205,656 B2 | 4/2007 | Kim et al. |
| 7,206,447 B2 | 4/2007 | Wang |
| 7,223,626 B2 | 5/2007 | Farnworth et al. |
| 7,224,020 B2 | 5/2007 | Wang et al. |
| 7,230,343 B2 | 6/2007 | Wang et al. |
| 7,245,007 B1 | 7/2007 | Foster |
| 7,253,493 B2 | 8/2007 | Wang et al. |
| 7,259,435 B2 | 8/2007 | Wang |
| 7,285,442 B2 | 10/2007 | Moden et al. |
| 7,285,848 B2 * | 10/2007 | Onodera et al. ............. 257/686 |
| 7,285,971 B2 | 10/2007 | Yee et al. |
| 7,290,080 B2 | 10/2007 | Patel |
| 7,314,812 B2 | 1/2008 | Wang |
| 7,327,020 B2 | 2/2008 | Kwon et al. |
| 7,339,257 B2 | 3/2008 | Ozawa et al. |
| 7,341,881 B2 | 3/2008 | Watkins et al. |
| 2001/0006828 A1 | 7/2001 | McMahon |
| 2003/0205826 A1 | 11/2003 | Lin et al. |
| 2003/0209787 A1 | 11/2003 | Kondo et al. |
| 2004/0042190 A1 | 3/2004 | Eng et al. |
| 2005/0054141 A1 | 3/2005 | Kim et al. |
| 2005/0090050 A1 | 4/2005 | Shim et al. |
| 2005/0253211 A1 | 11/2005 | Fukuda |
| 2005/0258853 A1 | 11/2005 | Sorimachi |
| 2005/0275750 A1 | 12/2005 | Akram et al. |
| 2006/0071314 A1 | 4/2006 | Ho et al. |
| 2006/0108676 A1 * | 5/2006 | Punzalan et al. ............ 257/686 |
| 2006/0113598 A1 | 6/2006 | Chen et al. |
| 2006/0118933 A1 | 6/2006 | Haba |
| 2006/0186514 A1 | 8/2006 | Shim et al. |
| 2006/0220208 A1 | 10/2006 | Onodera et al. |
| 2006/0220209 A1 | 10/2006 | Karnezos et al. |
| 2007/0004089 A1 | 1/2007 | Ebihara et al. |
| 2007/0007641 A1 | 1/2007 | Lee et al. |
| 2007/0048969 A1 | 3/2007 | Kwon et al. |
| 2007/0132081 A1 | 6/2007 | Wang et al. |
| 2007/0145556 A1 | 6/2007 | Bolken et al. |
| 2007/0166876 A1 | 7/2007 | Kim et al. |
| 2007/0190690 A1 | 8/2007 | Chow et al. |
| 2007/0210443 A1 | 9/2007 | Merilo et al. |
| 2007/0290318 A1 | 12/2007 | Tao et al. |
| 2008/0026506 A1 | 1/2008 | Kim et al. |
| 2008/0048301 A1 | 2/2008 | Wang et al. |
| 2008/0054432 A1 | 3/2008 | Corisis et al. |

FOREIGN PATENT DOCUMENTS

| | | |
|---|---|---|
| JP | 55128835 | 10/1980 |
| JP | 56004241 | 1/1981 |
| JP | 60094744 | 5/1985 |
| JP | 60178651 | 9/1985 |
| JP | 62109326 | 5/1987 |
| JP | 62261133 | 11/1987 |
| JP | 02306639 | 12/1990 |
| JP | 04157758 | 5/1992 |
| JP | 62115834 | 5/1997 |
| JP | 2004312008 | 4/2004 |
| JP | 2007288189 | 1/2007 |
| KR | 1062512 | 7/2001 |
| TW | 0242869 | 11/2005 |
| TW | 0255023 | 5/2006 |
| TW | 278947 | 4/2007 |
| WO | 0070676 | 11/2000 |
| WO | 2005083789 | 9/2005 |

OTHER PUBLICATIONS

Mita et al., Advanced TAB/BGA Multi-Chip Stacked Module for High Density LSI Packages, IEEE, Multi-Chip Module Conference, 1994, Publication Date Mar. 15-17, 1994, pp. 68-76.

Ammann et al., Multichip Packaging in QFPs by PBO-Multilayer High Density Interconnect, 1998 International Conference on Multichip Modules and High Density Packaging, Publication Date, Apr. 15-17, 1998, pp. 29-34.

Rencz, Thermal Qualification of 3D Stacked Die Structures, Budapest University of Technology and Economics, Department of Electron Devices, 2006.

Yean et al., Pre-Encapsulated Cavity Interposer, U.S. Appl. No. 12/128,575, filed May 28, 2008.

Search Report for Singapore Application No. 200803157-7, mailed Aug. 25, 2009, eight (8) pages.

* cited by examiner

STACKABLE CERAMIC FBGA FOR HIGH THERMAL APPLICATIONS

CROSS-REFERENCE TO RELATED APPLICATIONS

This application is a divisional of application Ser. No. 11/063,403, filed Feb. 22, 2005, now U.S. Pat. 7,285,442, issued Oct. 23, 2007, which is a continuation of application Ser. No. 10/706,210, filed Nov. 12, 2003, now U.S. Pat. 6,858,926, issued Feb. 22, 2005, which is a divisional of application Ser. No. 09/924,635, filed Aug. 8, 2001, now U.S. Pat. 6,650,007, issued Nov. 18, 2003, which is a continuation of application Ser. No. 9/344,279, filed Jun. 30, 1999, now U.S. Pat. 6,297,548, issued Oct. 2, 2001, which claims the benefit of U.S. Provisional Application No. 60/091,205 filed Jun. 30, 1998. The disclosure of each of the previously referenced U.S. patent applications and patents referenced is hereby incorporated by reference in its entirety.

BACKGROUND OF THE INVENTION

1. Statement of the Invention

The present invention relates to an apparatus for high-temperature thermal applications for ball grid array semiconductor devices and a method of packaging ball grid array semiconductor devices.

2. State of the Art

Integrated semiconductor devices are typically constructed in wafer form with each device having the form of an integrated circuit die which is typically attached to a lead frame with gold wires. The die and lead frame are then encapsulated in a plastic or ceramic package, which is then commonly referred to as an integrated circuit (IC). ICs come in a variety of forms, such as a dynamic random access memory (DRAM), static random access memory (SRAM), read only memory (ROM), gate arrays, etc. The ICs are interconnected in many combinations on printed circuit boards by a number of techniques, such as socketing and soldering. Interconnection among ICs arrayed on a printed circuit board is typically made by conductive traces formed by photolithography and etching processes.

Such semiconductor devices typically take the form of the semiconductor die therein. The die is generally electrically attached to a lead frame within a package. The lead frame physically supports the die and provides electrical connections between the die and its operating environment. The die is generally electrically attached to the lead frame by means of fine gold wires. These fine gold wires function to connect the die to the lead frame so that the gold wires are connected electrically in series with the lead frame leads. The lead frame and die are then encapsulated. The packaged chip is then able to be installed on a circuit board by any desired manner, such as soldering, socketing, etc.

However, as the speed of the semiconductor die increases, the heat generated during operation increases. Additionally, it becomes necessary to shorten the leads between the printed circuit board on which the IC is located and the IC device itself in order to keep the impedance of the circuit from affecting the response speed of the IC device.

The wires connecting the leads of the lead frame to the bond pads on the active surface of the semiconductor die in an IC package are not an effective connection for high operating speed semiconductor dice as the wires slow down the response of the semiconductor die.

Therefore, a packaging is required for semiconductor dice which have high operating speeds and generate heat associated therewith while minimizing the lead length between the semiconductor dice and the printed circuit boards on which they are mounted.

BRIEF SUMMARY OF THE INVENTION

The present invention comprises an apparatus package for high-temperature thermal applications for ball grid array semiconductor devices and a method of packaging ball grid array semiconductor devices.

The present invention will be better understood when the drawings are taken in conjunction with the description of the invention.

DETAILED DESCRIPTION OF THE INVENTION

Figure 1:
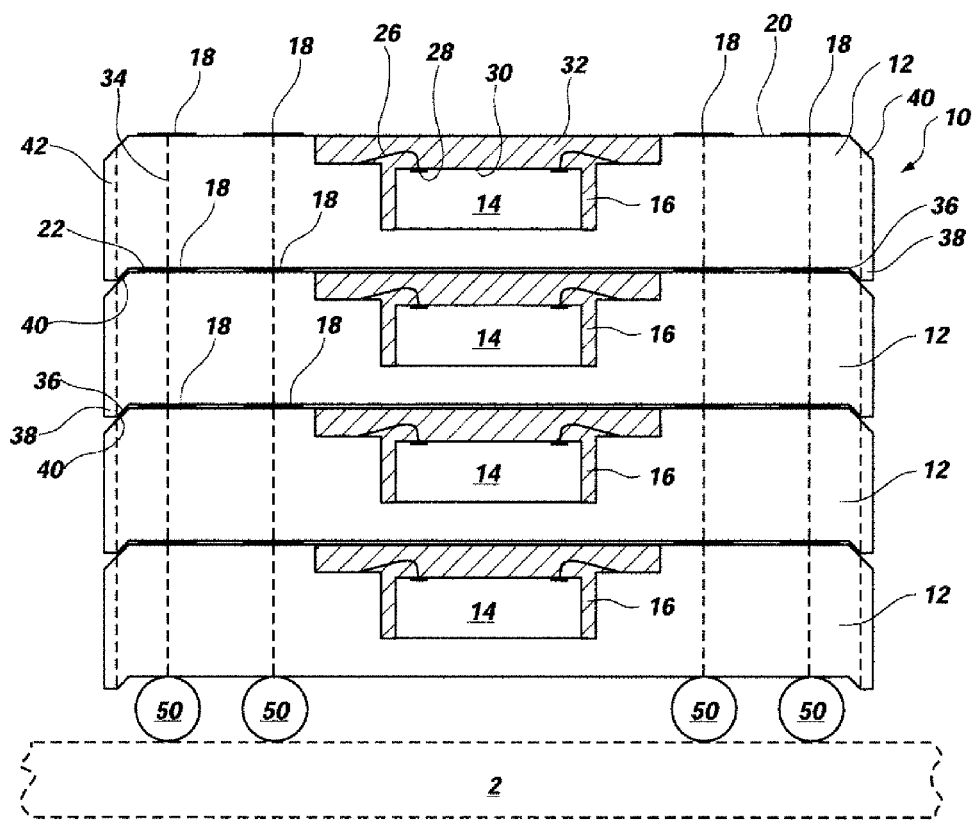
FIG. 1 is a cross-sectional view of a stack of a first embodiment of the packaged semiconductor dice of the present invention on a printed circuit board.

Referring to drawing FIG. 1, a plurality of assemblies 10 comprising a carrier 12 and a semiconductor device 14 located therein is illustrated installed on a substrate 2. Each carrier 12 comprises a member having a cavity 16 therein. As illustrated, the cavity 16 may be a single-level or multi-level cavity having any desired number of levels therein. The carrier 12 is formed having a plurality of contact pads 18 located on the upper surface 20 and lower surface 22 thereof which is connected by circuits 24 (not shown) and by wire bonds 26 to the bond pads 28 located on the active surface 30 of the semiconductor die or device 14. The semiconductor die or device 14 is initially retained within the cavity 16 by any suitable means, such as adhesive, etc. The circuits 24 (not shown) are formed on the upper surface 20 of the carrier 12 and portions of the walls or surfaces of the cavity 16 by any suitable well-known means, such as deposition and etching processes. The wire bonds 26 connecting the bond pads 28 of the semiconductor die or device 14 to the circuits 24 (not shown) are made using any suitable commercially available wire bonder. After the wire bonds 26 are formed, the cavity 16 is filled with suitable encapsulant material 32 covering and sealing the semiconductor die 14 in the cavity 16 and sealing the wire bonds 26 in position therein.

The carriers 12 may be of any desired geometric shape. The carrier 12 is formed having internal circuits 34 extending between the contact pads 18 on the upper surface 20 and lower surface 22 of the carrier 12. The carrier 12 is formed having frusto-conical recess surfaces 36, lips 38, and frusto-conical surfaces 40 on the upper surface 20. The surfaces 36 and 40 are formed having complementary angles so that the surfaces 36 and lips 38 of an adjacent carrier 12 mate or nest with an adjacent carrier 12 having frusta-conical surfaces 40 thereon, thereby forming a stable, self-aligning stack of carriers 12. If desired, the carriers 12 may be formed having a plurality of heat transfer fins 42 thereon. The carrier 12 may be formed of any desired suitable material, such as ceramic material, high-temperature plastic material, etc. The carrier 12 may be formed by any suitable method, such as molding, extrusion, etc.

Once a plurality of carriers 12 having semiconductor die or devices 14 therein is formed as an assembly, the assembly is connected to the substrate 2 using a plurality of reflowed solder balls 50. The substrate 2 includes circuitry thereon, on either the upper surface or lower surface or both, and therein, as well as conductive vias, if desired. The substrate 2 may be any suitable substrate, such as a printed circuit board, FR-4 board, etc. Any desired number of carriers 12 may be stacked to form an assembly on the substrate 2. As illustrated, the reflowed solder balls 50 are located in alignment with the contact pads 18 and the connecting internal circuits 34 extending between the contact pads 18 on the upper surface 20 and lower surface 22 of a carrier 12.

Figure 2:
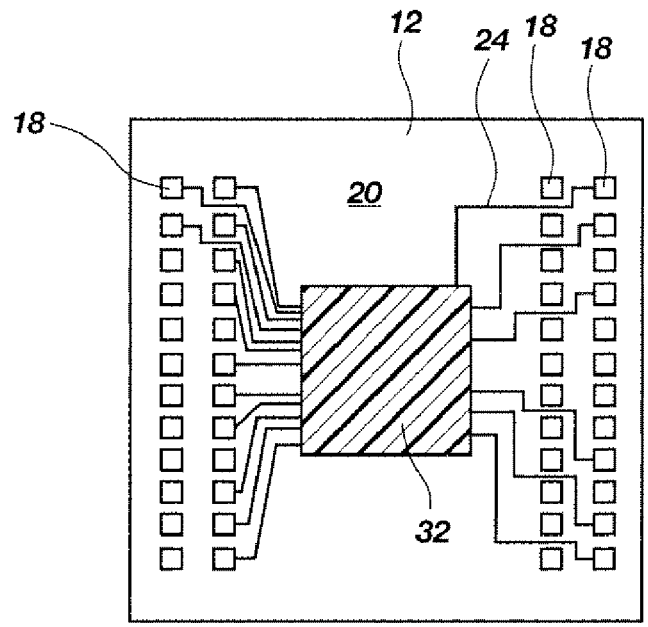
FIG. 2 is a top view of a packaged semiconductor die of the present invention.

Referring to drawing FIG. 2, a carrier 12 having circuits 24 thereon extending between contact pads 18 on the upper surface 20 of the carrier 12 is illustrated. For purposes of clarity, only a portion of the circuits 24 extending on the upper surface 20 of the carrier 12 is illustrated.

Figure 3:
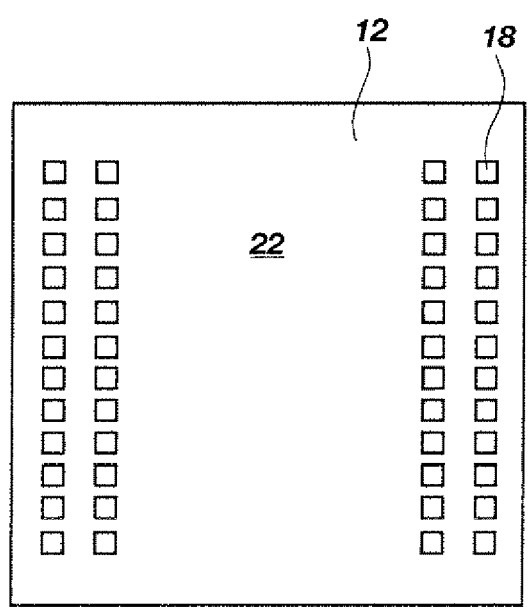
FIG. 3 is a bottom view of a packaged semiconductor die of the present invention.

Referring to drawing FIG. 3, the lower surface 22 of a carrier 12 is illustrated having a plurality of contact pads 18 located thereon.

Figure 4:
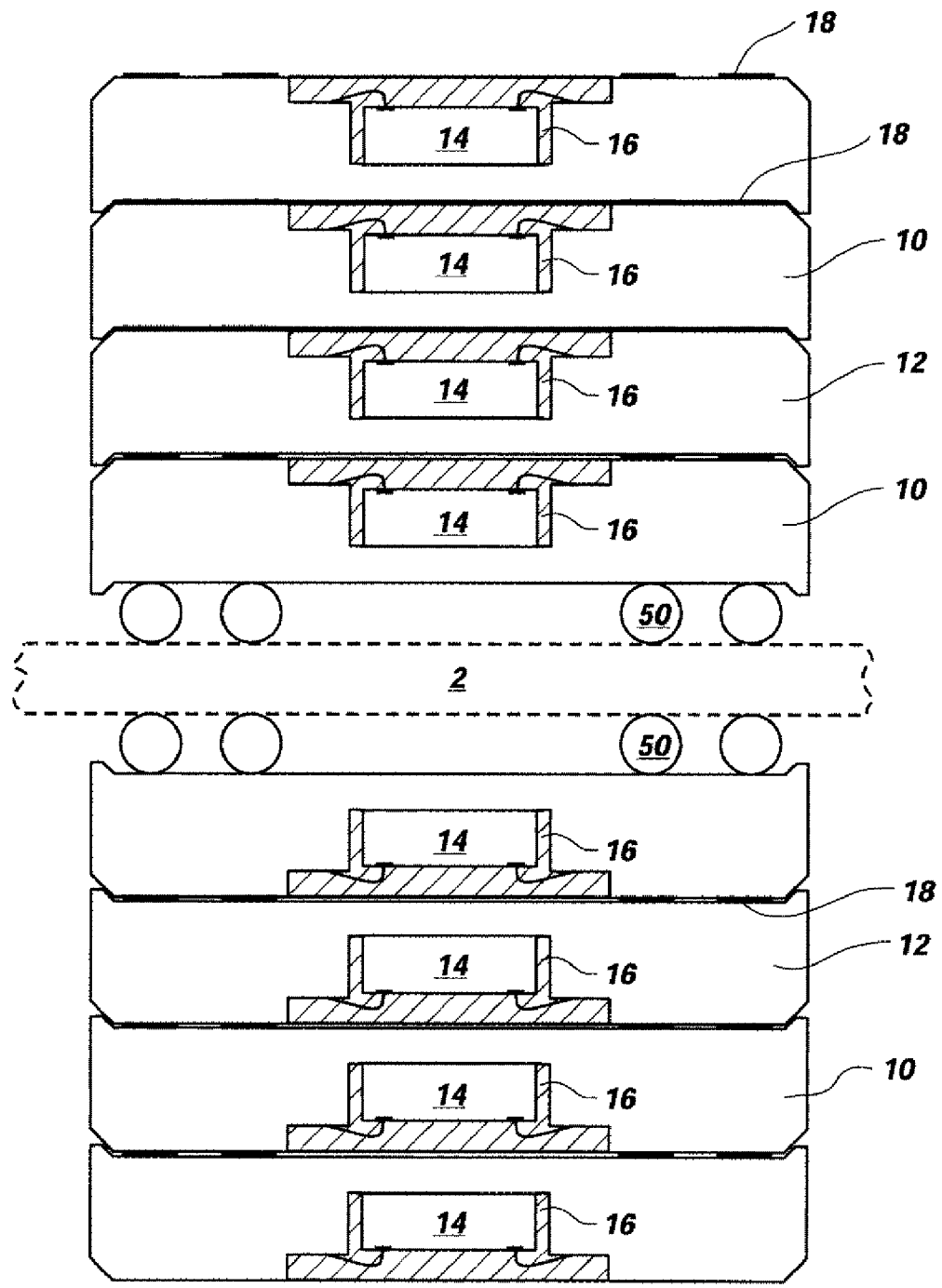
FIG. 4 is a cross-sectional view of stacks of the packaged semiconductor dice of the present invention on both sides of a printed circuit board.

Referring to drawing FIG. 4, a plurality of assemblies 10 is illustrated located on both sides of a substrate 2 being connected to the circuitry thereon by a plurality of reflowed solder balls 50.

Figure 5:
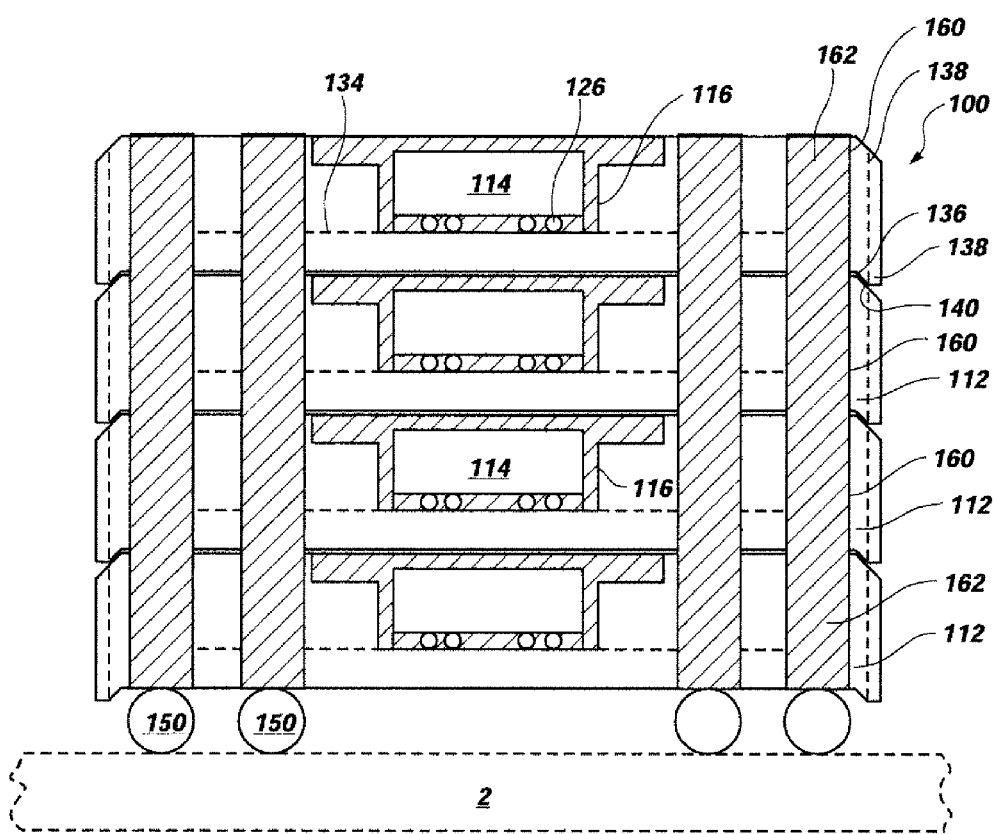
FIG. 5 is a cross-sectional view of a stack of a second embodiment of the packaged semiconductor die of the present invention on a printed circuit board.

Referring to drawing FIG. 5, a second embodiment of the present invention is illustrated. A plurality of assemblies 100 is stacked on a substrate 2, being electrically and mechanically connected thereto by reflowed solder balls 150. Each assembly 100 comprises a carrier 112 having a cavity 116 therein containing a semiconductor die or device 114 therein. The semiconductor die or device 114 is electrically connected to the circuits 134 of the carrier 112 by reflowed solder balls 126. Each carrier 112 is formed having apertures 160 therethrough connecting with circuits 134. Each carrier 112 is formed with surfaces 136 and 140 as well as lips 138 as described hereinbefore with respect to carrier 12. To connect each carrier 112 to an adjacent carrier 112, a conductive material 162, such as conductive epoxy, solder, etc., is used to fill the apertures 160 in the carriers and contact the conductive material 162 in adjacent carriers 112.

The carriers 112 are similar in construction to the carriers 12 as described hereinbefore, except for the apertures 160, conductive material 162, circuits 134, and reflowed solder balls 126 between the semiconductor die or device 114 and the circuits 134

The substrate 2 is the same as described hereinbefore.

Figure 6:
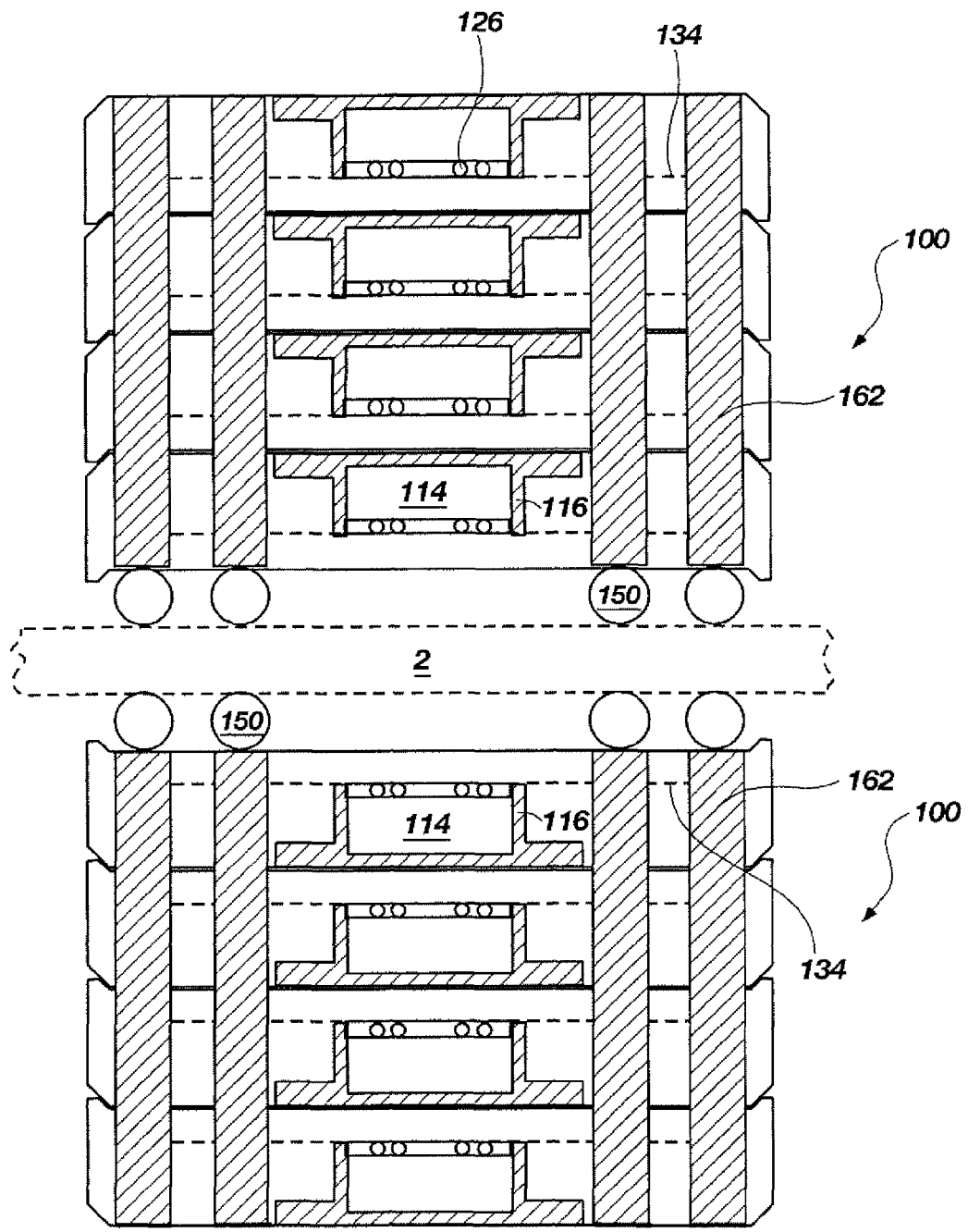
FIG. 6 is a cross-sectional view of stacks of the second embodiment of the present invention on both sides of a printed circuit board.

Referring to drawing FIG. 6, a plurality of assemblies 100 is illustrated stacked on both sides of a substrate 2, being electrically and mechanically connected thereto by reflowed solder balls 150.

The present invention includes additions, deletions, modifications, and alterations which are within the scope of the claims.

What is claimed is:

1. An assembly using a stackable FBGA comprising:
   a first carrier having a plurality of sides, having an upper surface, having a bottom surface, having a cavity extending from the upper surface, a first frusto-conical surface on a portion of the upper surface thereof, a second frusto-conical surface on a portion of the bottom surface thereof, a lip on a portion of a bottom surface thereof, and a plurality of circuits located within a portion of the cavity;
   a semiconductor device having a plurality of bond pads located within the cavity of the first carrier;
   a first connector between at least one circuit of the plurality of circuits located within the portion of the cavity of the first carrier and at least one bond pad of the plurality of bond pads of the semiconductor device;
   encapsulant material filling a portion of the cavity in the first carrier; and
   a second connector material located within the first carrier.

2. The assembly using a stackable FBGA of claim 1, further comprising:
   a substrate having an upper surface, a lower surface, and a plurality of circuits on the upper surface thereof; and
   at least one second connector connected to the second connector material in the first carrier and at least one circuit of the plurality of circuits on the upper surface of the substrate.

3. The assembly using a stackable FBGA of claim 1, wherein the first carrier includes at least one fin on a portion thereof.

4. The assembly of claim 1, further comprising:
   a second carrier oriented with respect to the first carrier and positioned in the same direction as the first carrier and further having a cavity therein, an upper surface, a lower surface, at least one aperture therethrough, and a plurality of circuits located within a portion of the cavity thereon connected to the at least one aperture therethrough;
   a second semiconductor device having an active surface having a plurality of bond pads thereon, the second semiconductor device located within the cavity of the second carrier;
   another first connector between at least one circuit of the plurality of circuits located within the portion of the cavity of the second carrier and at least one bond pad of the plurality of bond pads on the active surface of the second semiconductor device located within the cavity of the second carrier;
   encapsulant material filling the portion of the cavity in the second carrier; and
   a connector material located within a second aperture in the second carrier connected to the second connector material in the at least one aperture in the first carrier.

5. An assembly for use with a FBGA substrate comprising:
   a first carrier having a first surface having a first frusto-conical surface and at least one connection pad thereon, having a second surface having a lip, a second frusto-conical surface connected to the lip, and at least one connection pad thereon, having a cavity extending from the upper surface therein, a first surface located in the cavity having at least one connection pad thereon, a second surface located in the cavity having at least one connection pad thereon, and a third surface located in the cavity, a circuit connecting the at least one connection pad on the first surface of the first carrier to the at least one connection pad on the second surface of the first carrier, and at least one circuit located in a portion of the cavity connected to the at least one connection pad on one of the first surface located in the cavity and the second surface located in the cavity, the at least one connection pad on the first surface of the first carrier, and the at least one connection pad on the second surface of the first carrier;

a semiconductor device having an active surface having at least one bond pad thereon, the semiconductor device located on the third surface located in the cavity of the first carrier;

a first connector between the at least one connection pad on one of the first surface located in the cavity and the second surface located in the cavity and the at least one bond pad on the active surface of the semiconductor device; and encapsulant material filling a portion of the cavity in the first carrier.

6. The assembly of claim 5, further comprising:
a substrate having a first surface, a second surface, and at least one circuit on the first surface thereof; and
at least one second connector connected to the at least one connection pad on the second surface of the first carrier and the at least one circuit on the first surface of the substrate.

7. The assembly of claim 5, wherein the first carrier includes at least one fin on a portion thereof.

8. The assembly of claim 5, further comprising:
a second carrier having a cavity therein, a first surface, a second surface, at least one connection pad on the first surface, at least one connection pad on the second surface, a circuit connecting the at least one connection pad on the first surface to the at least one connection pad on the second surface, and at least one circuit located in a portion of the cavity and connected to one of the at least one connection pad on the first surface and the at least one connection pad on the second surface;

a semiconductor device having an active surface having at least one bond pad thereon, the semiconductor device located within the cavity of the second carrier;

a first connector between the at least one circuit located in a portion of the cavity of the second carrier and the at least one bond pad on the active surface of the semiconductor device; and encapsulant material filling a portion of the cavity in the second carrier.

9. An assembly of stacked carriers for use with a substrate comprising:
a first carrier having a first frusto-conical surface on a portion of an upper surface thereof, a second frusto-conical surface on a portion of a bottom surface thereof, a lip on a portion of the bottom surface thereof, and a plurality of circuits located within a portion of a cavity having a first surface, a second surface, and a third surface, a connection pad located on one of the first surface and the second surface connected to at least one of the plurality of circuits;

a semiconductor device having a plurality of bond pads located on a portion of the third surface within the cavity of the first carrier;

a first connector between at least one circuit of the plurality of circuits located within the portion of the cavity of the first carrier and at least one bond pad of the plurality of bond pads of the semiconductor device;

encapsulant material filling a portion of the cavity in the first carrier; and a second connector material located within the first carrier.

10. The assembly of stacked carriers for use with a substrate of claim 9, wherein the substrate includes an upper surface, a lower surface, and a plurality of circuits on the upper surface thereof, and at least one second connector connected to the second connector material in the first carrier and at least one circuit of the plurality of circuits on the upper surface of the substrate.

11. The assembly of stacked carriers for use with a substrate of claim 9, wherein the first carrier includes a heat sink on a portion thereof.

12. The assembly of claim 9, further comprising:
a second carrier oriented with respect to the first carrier and positioned in the same direction as the first carrier and further having a cavity therein, an upper surface, a lower surface, at least one aperture therethrough, and a plurality of circuits located within a portion of the cavity thereon connected to the at least one aperture therethrough;

a second semiconductor device having an active surface having a plurality of bond pads thereon, the second semiconductor device located within the cavity of the second carrier;

another first connector between at least one circuit of the plurality of circuits located within the portion of the cavity of the second carrier and at least one bond pad of the plurality of bond pads on the active surface of the second semiconductor device located within the cavity of the second carrier;

encapsulant material filling the portion of the cavity in the second carrier; and a connector material located within a second aperture in the second carrier connected to the second connector material in the at least one aperture in the second carrier.

13. An assembly formed by a plurality of carriers for high thermal usage comprising:
a first carrier having an upper surface, having a lower surface, having a cavity therein extending from the upper surface, a first surface located in a portion of the cavity having at least one connection pad thereon, a second surface located in a portion of the cavity, and a third surface located within a portion of the cavity, a first frusto-conical surface on a portion of the upper surface thereof, a second frusto-conical surface on a portion of the lower surface thereof, a lip on a portion of a lower surface thereof, at least one connection pad on the upper surface, at least one connection pad on the lower surface, a circuit connecting the at least one connection pad on the upper surface to the at least one connection pad on the lower-surface, and at least one circuit located in a portion of the cavity connected to the at least one connection pad on the upper surface, to the at least one connection pad on the lower surface, and to the at least one connection pad on the first surface located in the cavity;

a semiconductor device having an active surface having at least one bond pad thereon, the semiconductor device located within the cavity of the first carrier on a portion of the third surface of the cavity;

a first connector between the at least one circuit located in a portion of the cavity of the first carrier and the at least one bond pad on the active surface of the semiconductor device; and encapsulant material filling a portion of the cavity in the first carrier.

14. The assembly of claim 13, further comprising:
a substrate including a first surface, a second surface, and at least one circuit on the first surface thereof, and at least one second connector connected to the at least one connection pad on the second surface of the first carrier and the at least one circuit on the first surface of the substrate.

15. The assembly of claim 13, wherein the first carrier includes at least one fin on a portion thereof.

16. The assembly of claim 13, further comprising:
a second carrier having a cavity therein, an upper surface, a lower surface, at least one connection pad on the upper surface, at least one connection pad on the lower surface, a circuit connecting the at least one connection pad on the upper surface to the at least one connection pad on the lower surface, and at least one circuit located in a portion of the cavity connected to one of the at least one connection pad on the upper surface and the at least one connection pad on the lower surface;
a semiconductor device having an active surface having at least one bond pad thereon, the semiconductor device located within the cavity of the second carrier;
a first connector between the at least one circuit located in a portion of the cavity of the second carrier and the at least one bond pad on the active surface of the semiconductor device; and
encapsulant material filling a portion of the cavity in the second carrier.

17. The assembly of claim 16, further comprising:
a third carrier having a cavity therein, an upper surface, a lower surface, at least one connection pad on the upper surface, at least one connection pad on the lower surface, a circuit connecting the at least one connection pad on the upper surface to the at least one connection pad on the lower surface, and at least one circuit located in a portion of the cavity connected to one of the at least one connection pad on the upper surface and the at least one connection pad on the lower surface;
a semiconductor device having an active surface having at least one bond pad thereon, the semiconductor device located within the cavity of the third carrier;
a first connector between the at least one circuit located in a portion of the cavity of the third carrier and the at least one bond pad on the active surface of the semiconductor device; and
encapsulant material filling a portion of the cavity in the first carrier, second carrier, and third carrier.

18. The assembly of claim 17, further comprising:
a fourth carrier having a cavity therein, an upper surface, a lower surface, at least one connection pad on the upper surface, at least one connection pad on the lower surface, a circuit connecting the at least one connection pad on the upper surface to the at least one connection pad on the lower surface, and at least one circuit located in a portion of the cavity connected to one of the at least one connection pad on the upper surface and the at least one connection pad on the lower surface;
a semiconductor device having an active surface having at least one bond pad thereon, the semiconductor device located within the cavity of the fourth carrier;
a first connector between the at least one circuit located in a portion of the cavity of the fourth carrier and the at least one bond pad on the active surface of the semiconductor device; and
encapsulant material filling a portion of the cavity in the fourth carrier.

* * * * *